（12) United States Patent
Ooi et al.

(10) Patent No.: US 9,731,666 B2
(45) Date of Patent: Aug. 15, 2017

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Tomohiro Ooi, Mie (JP); Shigeki Yamane, Mie (JP); Takehito Kobayashi, Mie (JP); Yukinori Kita, Mie (JP); Yoshikazu Sasaki, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/126,441

(22) PCT Filed: Apr. 1, 2015

(86) PCT No.: PCT/JP2015/060317
§ 371 (c)(1),
(2) Date: Sep. 15, 2016

(87) PCT Pub. No.: WO2015/152321
PCT Pub. Date: Oct. 8, 2015

(65) Prior Publication Data
US 2017/0080881 A1    Mar. 23, 2017

(30) Foreign Application Priority Data
Apr. 3, 2014    (JP) .................................. 2014-076764

(51) Int. Cl.
*H02G 3/08* (2006.01)
*B60R 16/023* (2006.01)
(Continued)

(52) U.S. Cl.
CPC ........... *B60R 16/0238* (2013.01); *H02G 3/03* (2013.01); *H02G 3/04* (2013.01); *H02G 3/08* (2013.01);
(Continued)

(58) Field of Classification Search
CPC .. H02G 3/03; H02G 3/04; H02G 3/08; H02G 3/081; H05K 1/0209; H05K 7/20418;
(Continued)

(56) References Cited

U.S. PATENT DOCUMENTS 6,411,515 B1 * 6/2002 Sakamoto ................ H04B 1/74
361/679.46
6,776,224 B1 * 8/2004 Chen .................... H01L 23/3672
361/697

(Continued)

FOREIGN PATENT DOCUMENTS

DE    102008042099 A1    3/2010
JP    2005-151624 A    6/2005
(Continued)

OTHER PUBLICATIONS

Search Report for European Application No. 15772794.2, dated Mar. 13, 2017, 6 pp.

*Primary Examiner* — Angel R Estrada
(74) *Attorney, Agent, or Firm* — Dinsmore & Shohl LLP

(57) ABSTRACT

An electrical junction box to be attached to a vehicle includes a heat dissipation member having a base plate portion that has a plate shape having a first surface and a second surface, a plurality of fins that protrude from the second surface, and a pedestal that is provided protruding (Continued)

from the second surface and that has a smaller protruding height from the second surface than the fins as well as a bracket having a pedestal attachment portion that is attached to the pedestal and a vehicle body attachment portion that is continuous with that attachment portion, extends in a direction away from the heat dissipation member, and is attachable to a vehicle body of the vehicle.

16 Claims, 11 Drawing Sheets

(51) Int. Cl.
    *H05K 1/02*     (2006.01)
    *H05K 7/20*     (2006.01)
    *H02G 3/03*     (2006.01)
    *H02G 3/04*     (2006.01)

(52) U.S. Cl.
    CPC ....... *H05K 1/0209* (2013.01); *H05K 7/20418* (2013.01); *H05K 7/20854* (2013.01); *H05K 2201/066* (2013.01)

(58) Field of Classification Search
    CPC ......... H05K 7/20854; H05K 2201/066; H05K 5/00; H05K 5/02; H05K 5/0213; B60R 16/0238; B60R 16/0239
    USPC .......... 174/50, 520, 17 R, 16.3, 17 VA, 526, 174/548, 559; 361/600, 601, 676, 677, 361/678, 679.01, 688, 659, 690, 703, 709, 361/710, 697, 679.46, 679.54; 439/76.1, 439/76.2
    See application file for complete search history.

(56) References Cited

U.S. PATENT DOCUMENTS

| | | | |
|---|---|---|---|
| 7,371,965 B2 * | 5/2008 | Ice | H05K 9/0058 174/50 |
| 7,957,148 B1 * | 6/2011 | Gallarelli | H01L 23/32 361/710 |
| 8,885,342 B2 * | 11/2014 | Skepnek | H01L 23/367 361/709 |
| 2010/0212864 A1 | 8/2010 | Tsai et al. | |
| 2014/0077591 A1 | 3/2014 | Saitou et al. | |

FOREIGN PATENT DOCUMENTS

| | | |
|---|---|---|
| JP | 2006136147 A | 5/2006 |
| JP | 2010224946 A | 10/2010 |
| JP | 5236109 B1 | 7/2013 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2015/060317 filed Apr. 1, 2015, which claims priority of Japanese Patent Application JP 2014-076764 filed Apr. 3, 2014.

FIELD OF THE INVENTION

The present invention relates to an electrical junction box equipped with a heat dissipation member.

BACKGROUND OF THE INVENTION

A circuit structure disclosed in Patent Document 1 has conventionally been known as a circuit structure to be installed in a vehicle. In this circuit structure, a heat dissipation member is attached to a lower surface of a case. This heat dissipation member is configured to dissipate heat generated by a circuit body disposed in the case to the outside of the case. A plurality of fins are formed on a lower surface of the heat dissipation member.

In circuit structures in which a plurality of fins are formed on a lower surface of a heat dissipation member as in the aforementioned technology, there may be cases where it is required that a bracket for fixing the circuit structure to a vehicle body of a vehicle be attached to the lower surface of the heat dissipation member. In such a case, for example, a configuration is conceivable in which an attachment portion for attaching the bracket is formed at leading ends of the fins and the bracket is attached to the attachment portion. However, in order to increase the heat dissipation efficiency, the fins are formed to be relatively thin, and so there is concern that the attachment strength between the bracket and the heat dissipation member may be low.

The present invention was made based on the above-described circumstances.

SUMMARY

The present invention provides an electrical junction box to be attached to a vehicle, the electrical junction box includes a heat dissipation member having a base plate portion that has plate shape having a first surface and a second surface, a plurality of fins that protrude from the second surface, and a pedestal that protrudes from the second surface and that has a smaller height protruding from the second surface than the fins as well as a bracket having a pedestal attachment portion that is attached to the pedestal and a vehicle body attachment portion that is continuous with the pedestal attachment portion, extends in a direction away from the heat dissipation member, and is attachable to a vehicle body of the vehicle.

According to the present invention, the bracket can be attached to the relatively heavy base plate portion at a position that is nearer to the base plate portion than leading end portions of the individual fins are. Thus, the attachment strength between the heat dissipation member and the bracket can be improved.

The following embodiments are preferable as embodiments of the present invention.

It is preferable that the bracket has a bottom wall, and the bottom wall is provided with a reinforcement portion protruding in a direction that intersects the bottom wall.

According to this embodiment, the bottom wall is provided with the reinforcement portion, and accordingly the attachment strength between the heat dissipation member and the bracket can be improved even more.

It is preferable that the bracket has a bottom wall and a side wall extending upright from a side edge of the bottom wall, and the side wall is configured to come into contact with the pedestal from a direction that intersects a direction in which the pedestal protrudes from the second surface.

According to this embodiment, it is possible to suppress movement of the bracket relative to the pedestal in the direction that intersects the direction in which the pedestal protrudes from the second surface. Thus, the attachment strength between the heat dissipation member and the bracket can be improved.

It is preferable that the bracket has a bottom wall, the bottom wall having a rib that protrudes from the bottom wall and extends in the direction away from the heat dissipation member, and the rib is accommodated in an accommodating recess provided in the pedestal.

According to this embodiment, the bottom wall is provided with the rib, and accordingly the strength of the bracket can be improved even more.

Moreover, since the rib is accommodated in the accommodating recess provided in the pedestal, positioning of the bracket and the pedestal can be easily performed.

It is preferable that one of the pedestal and the pedestal attachment portion has an engagement portion that is formed protruding toward the other of the pedestal and the pedestal attachment portion, and an engagement receiving portion engaging the engagement portion is formed in the other of the pedestal and the pedestal attachment portion.

According to this embodiment, due to the engagement between the engagement portion and the engagement receiving portion, positioning of the heat dissipation member and the bracket can be performed. Thus, the heat dissipation member and the bracket are assembled together at their proper positions, and therefore the assembly strength of the heat dissipation member and the bracket can be improved.

According to the present invention, it is possible to improve the attachment strength between the heat dissipation member and the bracket.

DETAILED DESCRIPTION

Embodiment 1

Embodiment 1 of the present invention will be described with reference to FIGS. 1 to 7. An electrical junction box 10 according to the present invention is connected between a power supply (not shown) installed in a vehicle 11 and a load (not shown) installed in the vehicle 11. In the following description, the X-direction will be referred to as "left-right direction", the Y-direction as "front-rear direction", and the Z-direction as "vertical direction".

Electrical Junction Box 10

Figure 1:
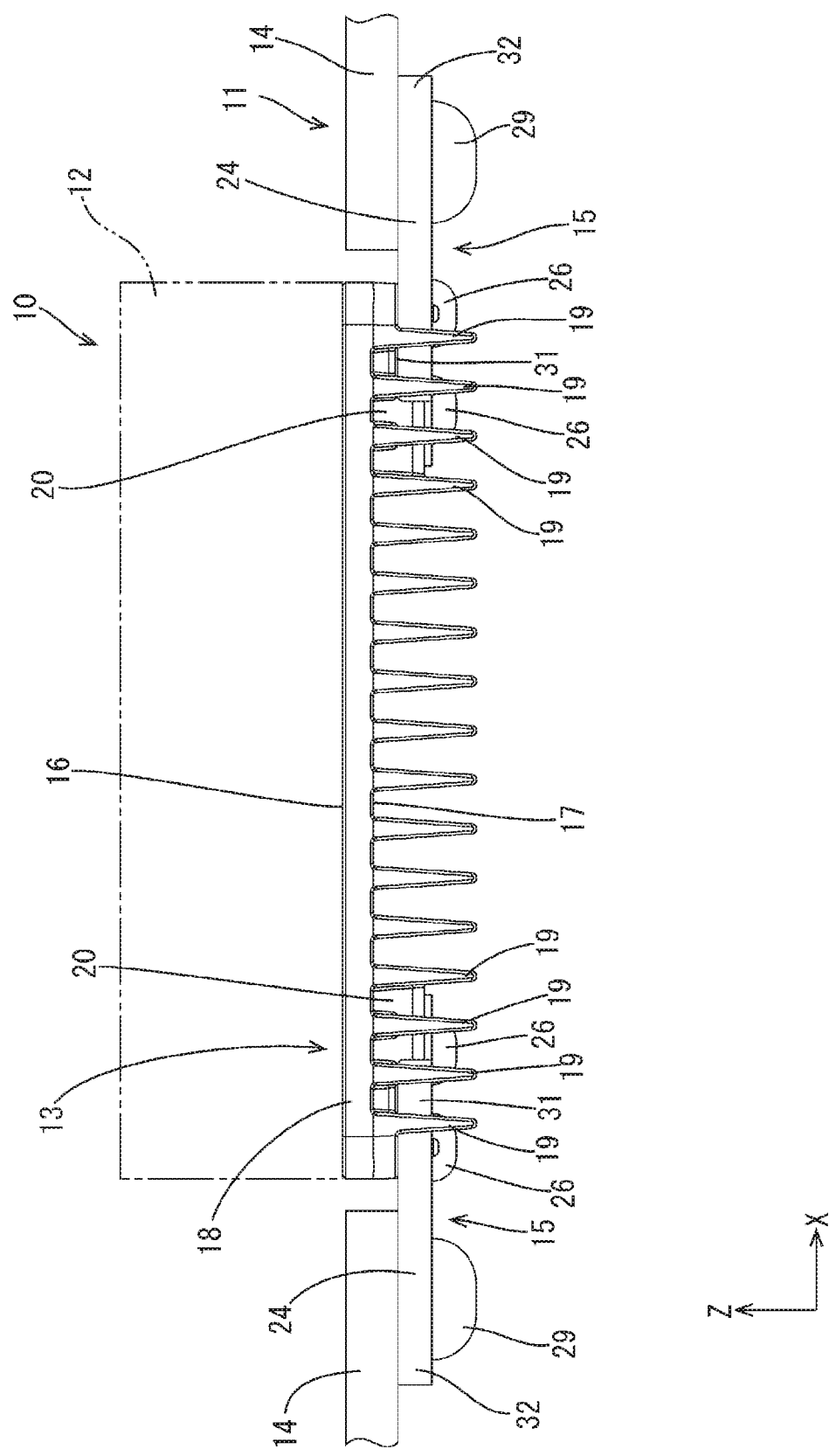
FIG. 1 is a side view showing an electrical junction box according to Embodiment 1 of the present invention.

As shown in FIG. 1, the electrical junction box 10 includes a heat dissipation member 13 attached to a case 12 and brackets 15 attached to the heat dissipation member 13 and also attached to a vehicle body 14 of the vehicle 11. A circuit board, which is not shown, is accommodated in the case 12.

Heat Dissipation Member 13

Figure 2:
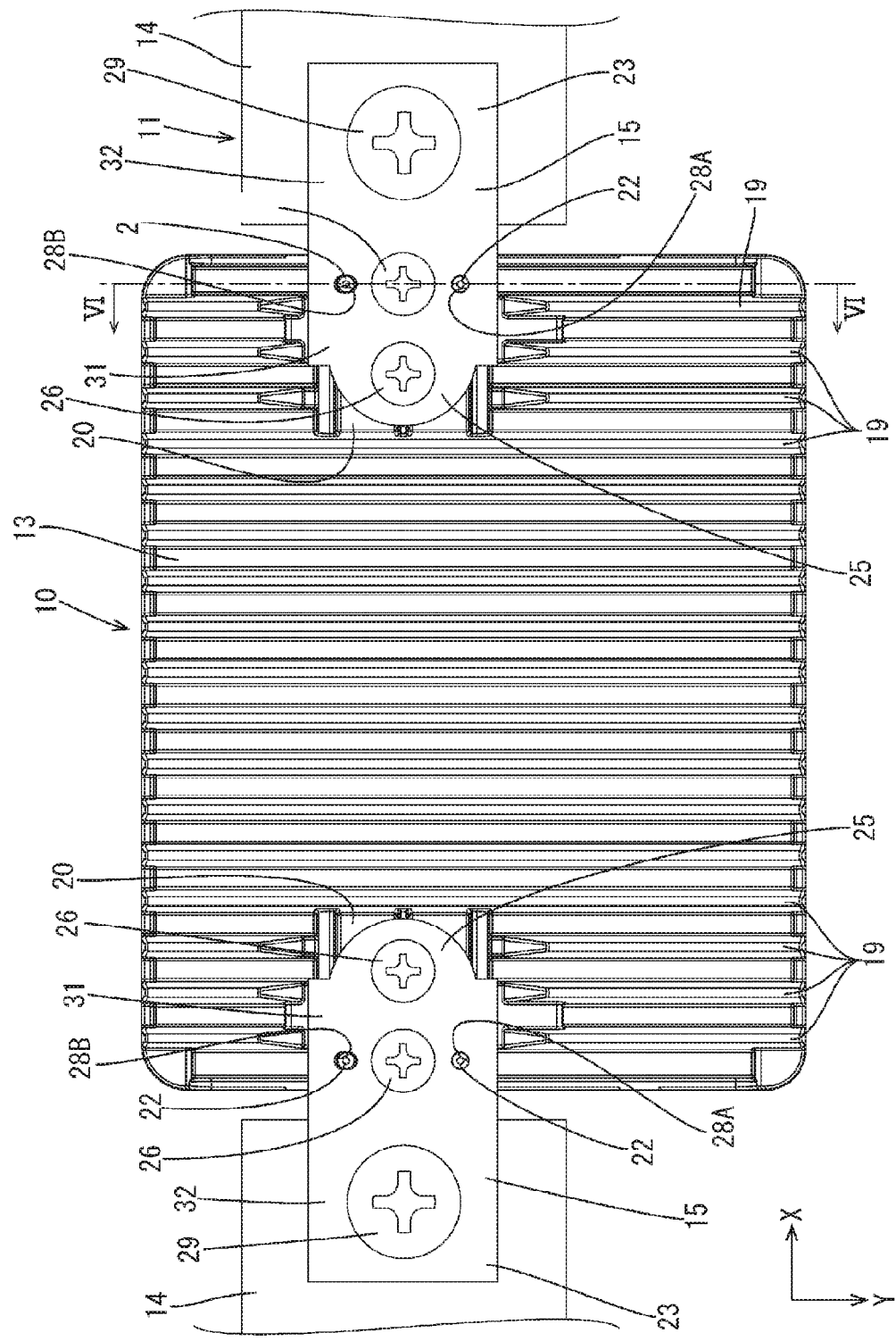
FIG. 2 is a bottom view showing the electrical junction box.

As shown in FIG. 2, the heat dissipation member 13 is made of metal and is substantially plate-shaped. The metal composing the heat dissipation member 13 can be selected from any suitable metal, such as aluminum, an aluminum alloy, iron, an iron alloy, copper, a copper alloy, and the like as necessary. In the present embodiment, aluminum or an aluminum alloy is used.

Figure 3:
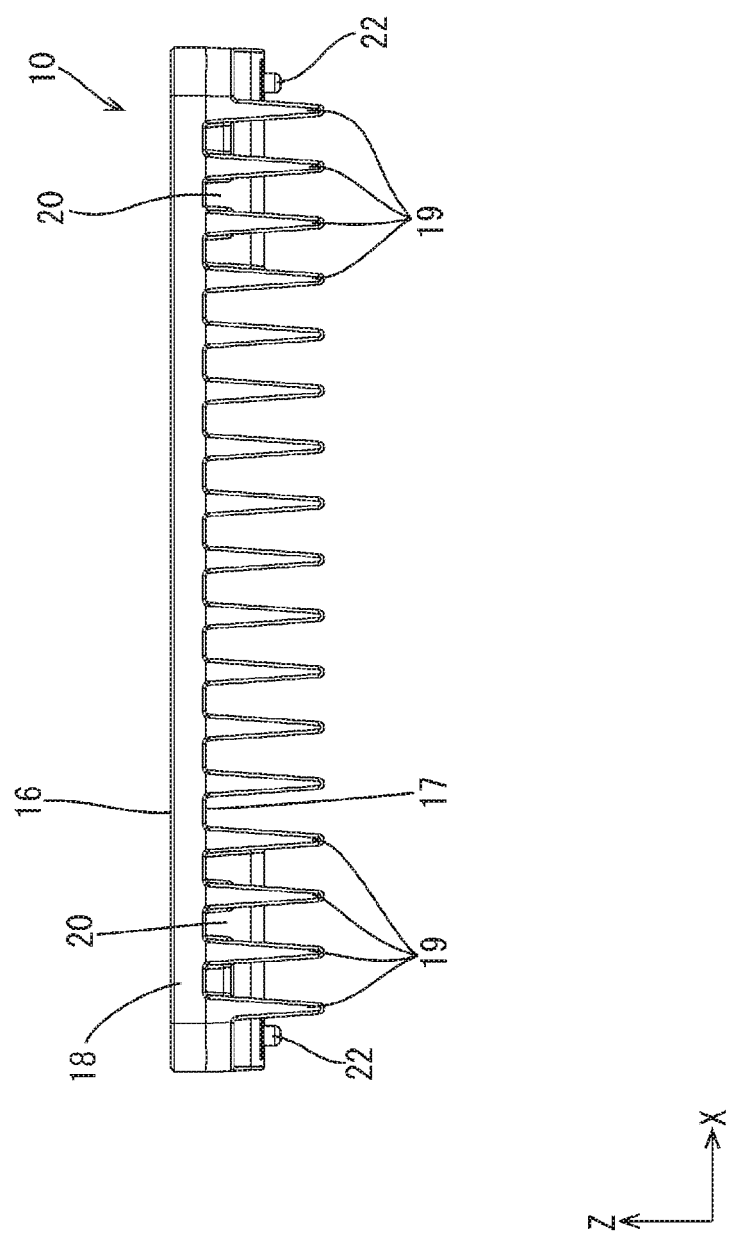
FIG. 3 is a side view showing a heat dissipation member.

As shown in FIG. 3, the heat dissipation member 13 includes a base plate portion 18 including a first surface 16 located on an upper side and a second surface 17 located on a lower side as well as a plurality of fins 19 protruding downward from the second surface 17 of the base plate portion 18. The cross-sectional shape of each fin 19 is a V-shape that is tapered down toward its lower end portion and that is elongated in the vertical direction. As shown in FIG. 2, the plurality of fins 19 extend in the front-rear direction and are lined up in the left-right direction at intervals.

In the present embodiment, the case 12 is attached to the first surface 16 of the base plate portion 18 using a known method such as screwing or a locking claw.

Figure 4:
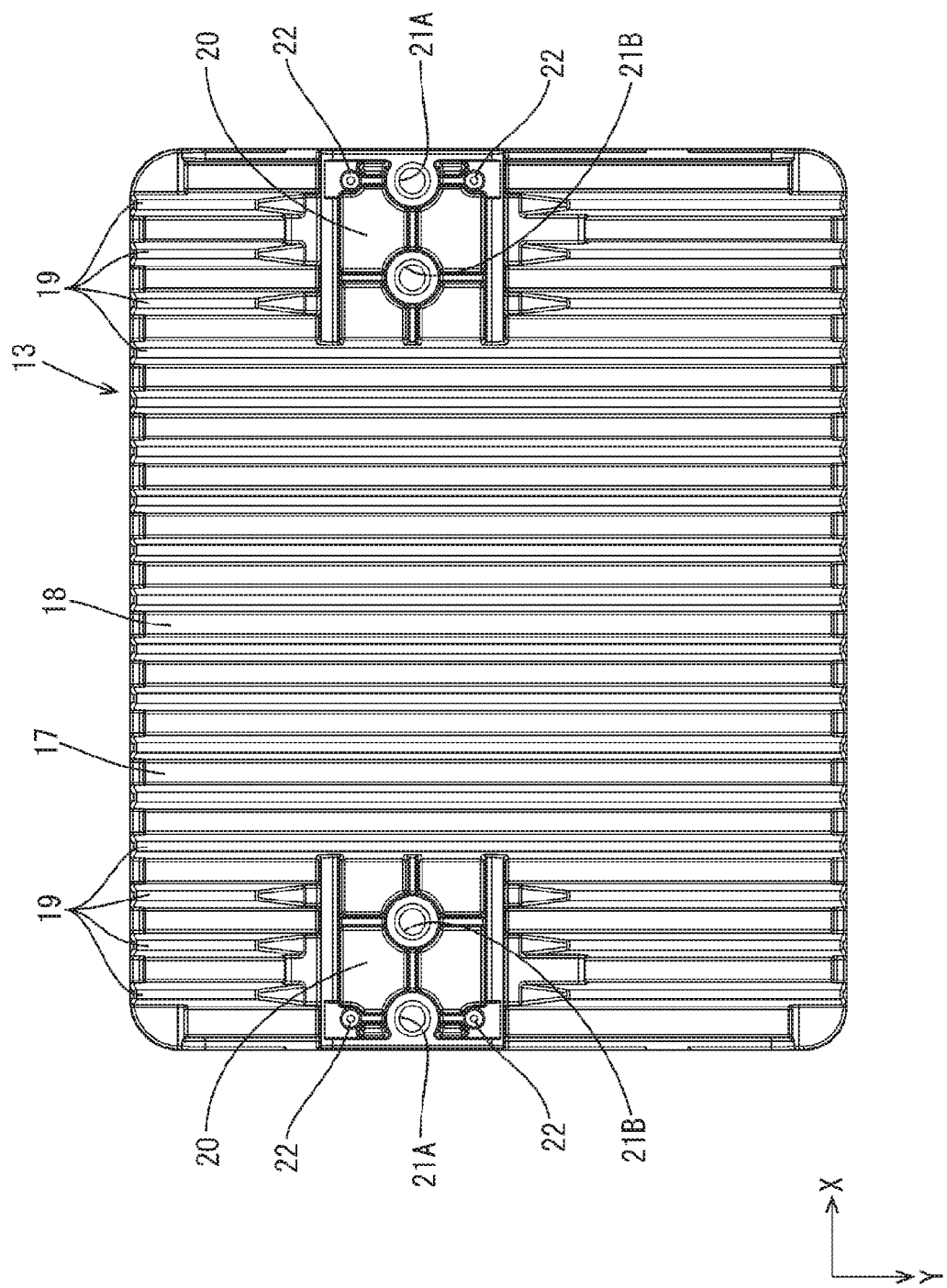
FIG. 4 is a bottom view showing the heat dissipation member.
Figure 5:
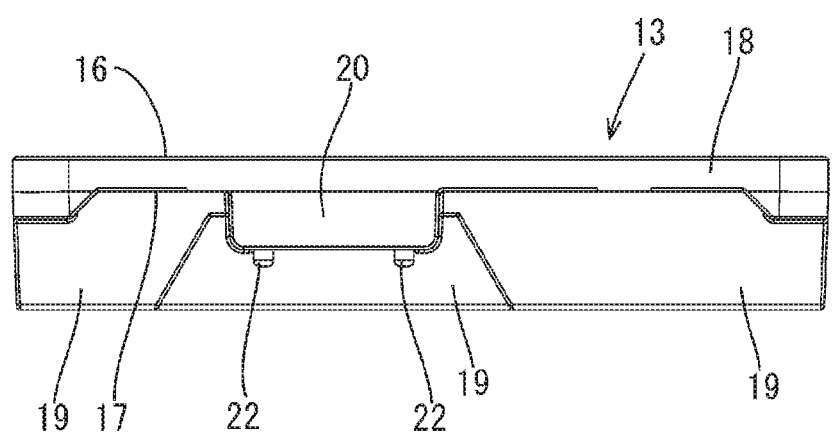
FIG. 5 is a side view showing the heat dissipation member when viewed from a direction different from that of FIG. 3.
Figure 5:
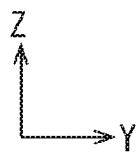

As shown in FIGS. 4 and 5, at a left end portion and a right end portion of the base plate portion 18, pedestals (support rests) 20 are formed on the second surface 17 of the base plate portion 18, the pedestals 20 protruding downward from the second surface 17 with the protruding height of the pedestals 20 from the second surface 17 being set to be smaller than that of the fins 19. The pedestals 20 are formed in a table shape having a substantially rectangular prism shape.

Two threaded holes 21A and 21B are formed in each pedestal 20, the two threaded holes 21A and 21B being lined up in the left-right direction with a space therebetween and extending in the vertical direction. Engagement portions 22 protruding downward are formed on each pedestal 20, the engagement portions 22 being located to the front and the rear, respectively, of the threaded hole 21A, which is the threaded hole, out of the threaded holes 21A and 21B, that is nearer to an end edge of the base plate portion 18. The engagement portions 22 have a substantially cylindrical shape. The vertical position of leading ends of the individual engagement portions 22 is set to be nearer to the base plate portion 18 than the vertical position of leading ends of the individual fins 19 is.

Bracket 15

Figure 7:
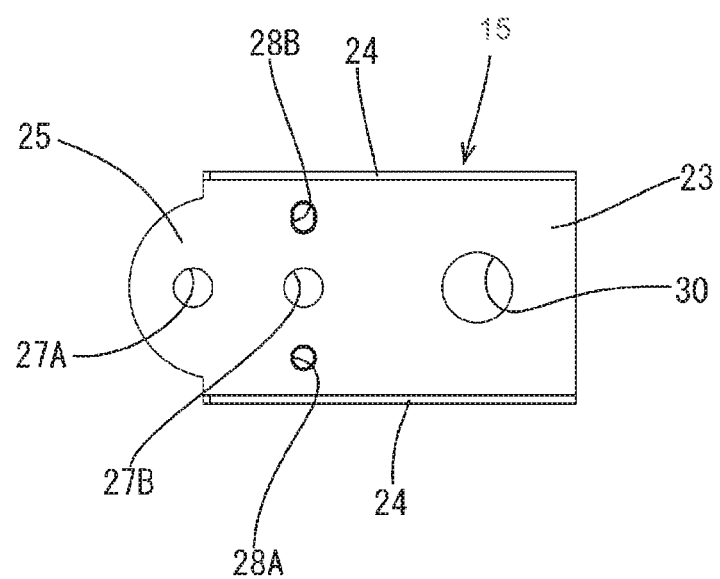
FIG. 7 is a bottom view showing a bracket.

As shown in FIG. 7, the brackets 15 each include a bottom wall 23 extending in the left-right direction and a pair of side walls 24 (an example of a reinforcement portion) extending upright to the upper side from both of left and right end edges, respectively, of the bottom wall 23. The pair of side walls 24 protrude from a wall surface of the bottom wall 23 in a direction that intersects (at right angles in the present embodiment) the bottom wall 23. The bottom wall 23 has a substantially rectangular shape when viewed from below, and an extended portion 25 is formed at one end edge portion of the bottom wall 23, the extended portion 25 extending outward in a substantially semi-circular shape.

A bolt insertion hole 27A into which a bolt 26 for fixing the bracket 15 and the heat dissipation member 13 is inserted is formed at a position in the bottom wall 23 that is near an end portion of the bottom wall 23 on the side where the extended portion 25 is formed, and the bolt insertion hole 27A passes through the bottom wall 23. On the opposite side of this bolt insertion hole 27A with respect to the extended portion 25, a bolt insertion hole 27B is formed passing through the bottom wall 23. The two bolt insertion holes 27A and 27B are spaced apart in the left-right direction.

Two engagement receiving portions 28A and 28B into which the engagement portions 22 formed on the pedestal 20 are respectively inserted and which pass through the bottom wall 23 are formed to the front and the rear, respectively, of the bolt insertion hole 27B, which is the bolt insertion hole, out of the two bolt insertion holes 27A and 27B, that is farther away from the end portion on the side where the extended portion 25 is formed. The engagement receiving portion 28A, of the engagement receiving portions 28A and 28B, is a circular hole, and the engagement receiving portion 28B is an elongated hole that is elongated in the front-rear direction.

The bracket 15 and the heat dissipation member 13 are positioned with respect to the front-rear direction and the left-right direction by bringing outer circumferential surfaces of the engagement portions 22 into contact with inner circumferential surfaces of the corresponding engagement receiving portions 28A and 28B.

A bolt insertion hole 30 into which a bolt 29 for fixing the vehicle body 14 and the bracket 15 is inserted is formed at a position in the bottom wall 23 that is near an end portion of the bottom wall 23 on the opposite side to the extended portion 25, and the bolt insertion hole 30 passes through the bottom wall 23. The inner diameter of this bolt insertion hole 30 is set to be larger than the inner diameter of the bolt insertion holes 27A and 27B for fixing the bracket 15 and the heat dissipation member 13. The heat dissipation member 13 and the bracket 15 are fixed by the bolts 26 being inserted into the respective bolt insertion holes 27A and 27B and screwed into the respective threaded holes 21A and 21B. Head portions of the bolts 26 screwed into the threaded holes 21A and 21B are at a position that is lower than the leading ends of the individual fins 19 (see FIG. 6).

As shown in FIG. 2, each bracket 15 includes a pedestal attachment portion 31 that is attached to a lower surface of the corresponding pedestal 20 and a vehicle body attachment portion 32 that is continuous with this pedestal attachment portion 31 and extends in a direction away from the heat dissipation member 13. The vehicle body attachment portion 32 constitutes a portion of the bracket 15 that is spaced apart from the pedestal 20. The pedestal attachment portion 31 includes the bottom wall 23 and the side walls 24.

Figure 6:
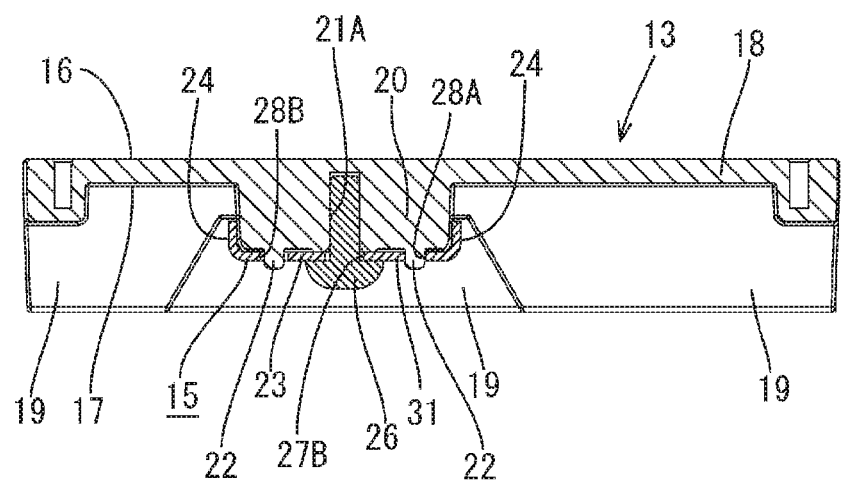
FIG. 6 is a cross-sectional view taken along line VI-VI in FIG. 2.
Figure 6:
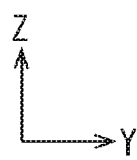

As shown in FIG. 6, in a state in which the bracket 15 is attached to the heat dissipation member 13, the side walls 24 of the bottom wall 23 come into contact with the pedestal 20 of the heat dissipation member 13 from a direction (front-rear direction in the present embodiment) that intersects the direction in which the pedestal 20 protrudes from the second surface 17 of the base plate portion 18. Moreover, the bottom wall 23 is placed overlapping the lower surface of the pedestal 20.

Effects of the Present Embodiment

Next, effects of the present embodiment will be described. The electrical junction box 10 according to the present embodiment is an electrical junction box 10 to be attached to the vehicle 11 and includes the heat dissipation member 13 made of metal, the heat dissipation member 13 having the base plate portion 18, which has a plate shape having the first surface 16 and the second surface 17, the plurality of fins 19, which protrude from the second surface 17, and the pedestal 20, which is provided protruding from the second surface 17 and which has a smaller protruding height from the second surface 17 than the fins 19, as well as the brackets 15, the brackets 15 each having the pedestal attachment portion 31, which is attached to the pedestal 20, and the vehicle body attachment portion 32, which is continuous with that attachment portion, extends in the direction away from the heat dissipation member 13, and is attachable to the vehicle body 14 of the vehicle 11.

With the above-described configuration, the brackets 15 can be attached to the pedestals 20 formed at positions that are nearer to the base plate portion 18 than the leading end portions of the individual fins 19 are. Thus, the brackets 15 can be attached to the heat dissipation member 13 at those positions in the heat dissipation member 13 that are near the relatively heavy base plate portion 18. As a result, for example, even when vibrations occur while the vehicle 11 is moving, the heat dissipation member 13 can be prevented from excessively vibrating, so that the attachment strength between the heat dissipation member 13 and the bracket 15 can be improved.

Moreover, the side walls 24, which protrude in a direction that is perpendicular to the bottom wall 23, are formed on the bottom wall 23 of each bracket 15. Thus, the bottom wall 23 of the bracket 15 is reinforced, so that the attachment strength between the heat dissipation member 13 and the bracket 15 can be improved even more.

Moreover, according to the present embodiment, each bracket 15 has the bottom wall 23 and the side walls 24, which extend upright from the side edges of the bottom wall 23, and the side walls 24 are configured to come into contact with the pedestal 20 from the direction that intersects the direction in which the pedestal 20 protrudes from the second surface 17. Thus, the bracket 15 can be prevented from moving relative to the pedestal 20 in the direction that intersects the direction in which the pedestal 20 protrudes from the second surface 17. Thus, the attachment strength between the heat dissipation member 13 and the bracket 15 can be improved.

Moreover, according to the present embodiment, the engagement portions 22, which protrude toward the pedestal attachment portion 31 of the bracket 15, are formed on the pedestal 20, and the engagement receiving portions 28A and 28B, which engage the corresponding engagement portions 22, are formed in the pedestal attachment portion 31 of the bracket 15. The heat dissipation member 13 and the bracket 15 can be positioned relative to each other by inserting the engagement portions 22 into the engagement receiving portions 28A and 28B and bringing the engagement portions 22 into engagement with the engagement receiving portions 28A and 28B. Thus, the heat dissipation member 13 and the bracket 15 are assembled together at their proper positions, so that the assembly strength of the heat dissipation member 13 and the bracket 15 can be improved.

The manufacturing tolerance, or the assembly tolerance, between the pedestal 20 and the bracket 15 is adjusted by inserting the engagement portion 22, which is formed on the pedestal 20, into the engagement receiving portion 28B, which is formed in an elongated hole shape elongated in the front-rear direction, of the two engagement receiving portions 28A and 28B formed in the bracket 15.

Embodiment 2

Embodiment 2 of the present invention will be described with reference to FIGS. 8 to 11.

Bracket 50

Figure 8:
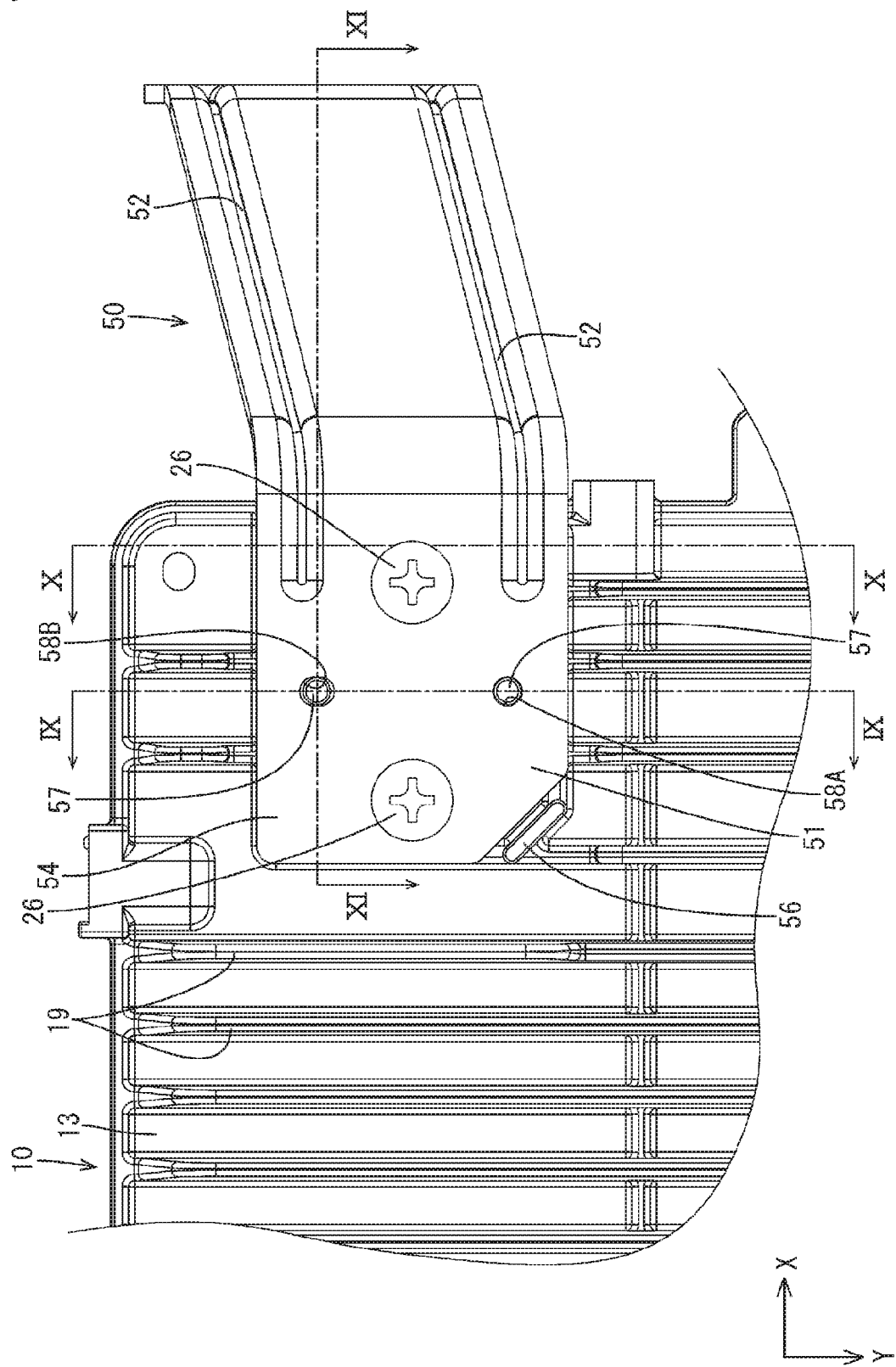
FIG. 8 is a partial enlarged bottom view showing an electrical junction box according to Embodiment 2.
Figure 11:
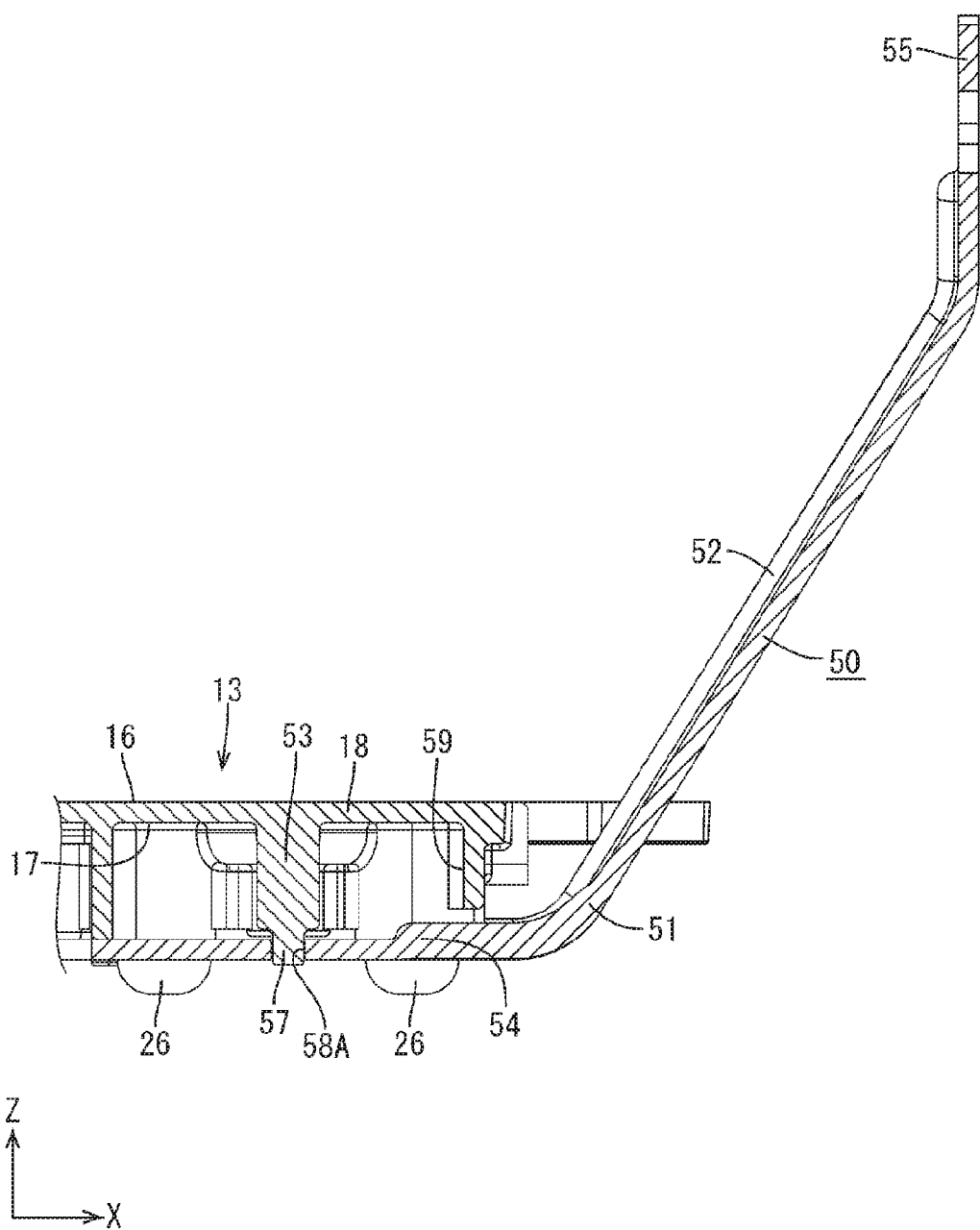
FIG. 11 is a cross-sectional view taken along line XI-XI in FIG. 8.

As shown in FIGS. 8 and 11, a bracket 50 has a bottom wall 51 extending in the left-right direction (an example of a direction away from the heat dissipation member), then extending obliquely right upward (an example of the direction away from the heat dissipation member), and furthermore extending upward (an example of the direction away from the heat dissipation member). A pair of ribs 52 (an example of the reinforcement portion) are formed at positions in the bottom wall 51 that are near front and rear end portions, respectively, of the bottom wall 51, the ribs 52 protruding from a wall surface of the bottom wall 51 and extending in the direction away from the heat dissipation member 13.

The bracket 50 includes a pedestal attachment portion 54 that is attached to a lower surface of a pedestal 53 and a vehicle body attachment portion 55 (shown in FIG. 11) that is continuous with this pedestal attachment portion 54 and extends in the direction away from the heat dissipation member 13. In the present embodiment, the vehicle body attachment portion 55 constitutes a portion of the bracket 50 that extends in the vertical direction.

When viewed from below, the pedestal attachment portion 54 has a substantially rectangular shape whose lower-left corner portion is cut away. A positioning rib 56 is formed at a position in the pedestal 53 that opposes the lower-left corner portion of the pedestal attachment portion 54, the positioning rib 56 extending from an obliquely left rear side to an obliquely right front side. During attachment of the pedestal attachment portion 54 to the pedestal 53, positioning can be easily performed by opposing this positioning rib 56 and the lower-left corner portion of the pedestal attachment portion 54 to each other.

Figure 9:
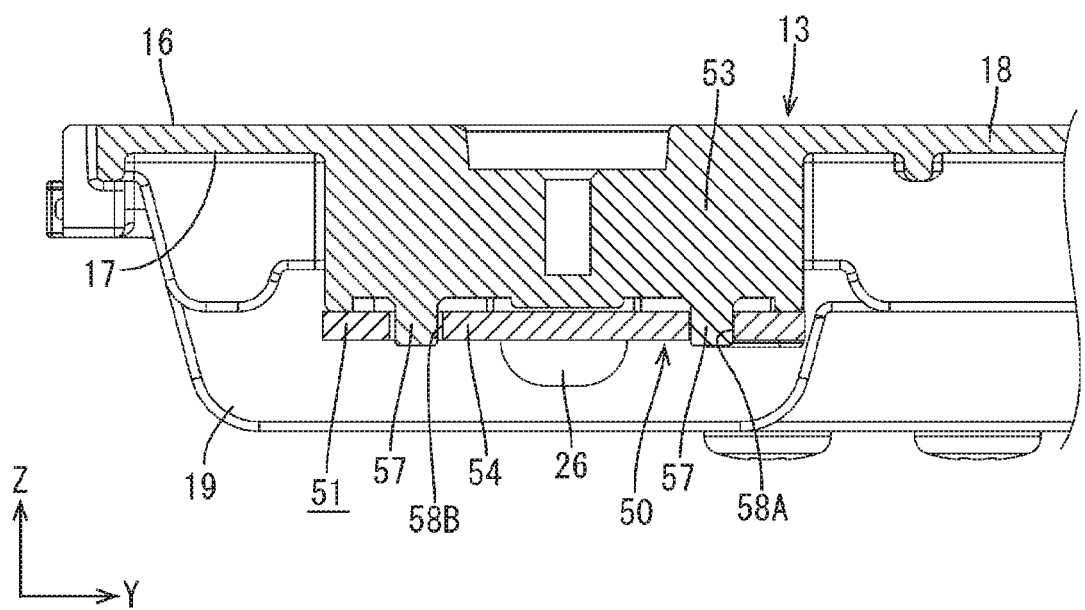
FIG. 9 is a cross-sectional view taken along line IX-IX in FIG. 8.

As shown in FIG. 9, a pair of engagement portions 57 are formed on the pedestal 53, the engagement portions 57 being spaced apart from each other in the front-rear direction and protruding downward. In the pedestal attachment portion 54, engagement receiving portions 58A and 58B passing through the pedestal attachment portion 54 are formed at positions corresponding to the respective engagement portions 57 in a state in which the pedestal attachment portion 54 is attached to the pedestal 53. The engagement receiving portion 58A, of the engagement receiving portions 58A and 58B, is a circular hole, and the engagement receiving portion 58B is an elongated hole that is elongated in the front-rear direction.

The bracket 50 and the heat dissipation member 13 are positioned with respect to the front-rear direction and the left-right direction by bringing outer circumferential surfaces of the engagement portions 57 into contact with inner circumferential surfaces of the corresponding engagement receiving portions 58A and 58B.

Figure 10:
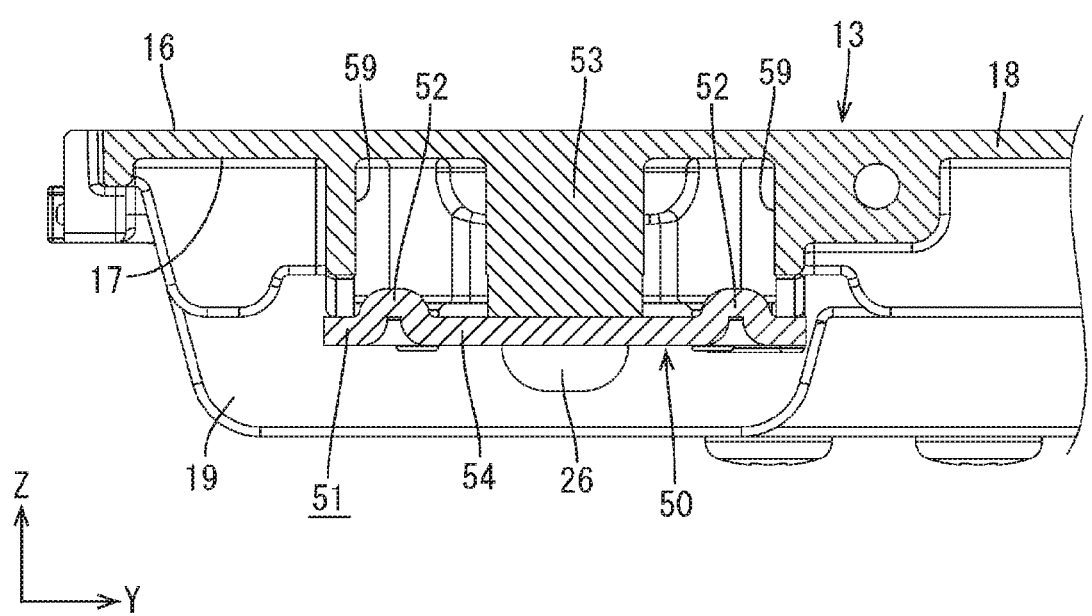
FIG. 10 is a cross-sectional view taken along line X-X in FIG. 8.

As shown in FIG. 10, two accommodating recesses 59 that are depressed upward are formed at positions in the pedestal 53 that correspond to the respective ribs 52 in a state in which the pedestal attachment portion 54 is attached to the pedestal 53, and the accommodating recesses 59 are lined up in the front-rear direction. In the state in which the pedestal attachment portion 54 is attached to the pedestal 53, the two ribs 52 are accommodated in the respective accommodating recesses 59. This configuration facilitates positioning of the pedestal 53 and the pedestal attachment portion 54.

As shown in FIG. 11, due to the engagement between the engagement portion 57 and the engagement receiving portion 58B as well as the engagement between the accommodating recesses 59 and the corresponding ribs 52, positioning of the pedestal 53 and the bracket 50 is easy.

Configurations other than those described above are substantially the same as those of Embodiment 1. Therefore, like members are denoted by like reference numerals, and redundant descriptions are omitted.

According to the present embodiment, the pair of ribs 52 are provided in the bottom wall 51 of the bracket 50. Thus, the strength of the bracket 50 can be improved even more.

Moreover, since the ribs 52 are accommodated in the accommodating recesses 59 provided in the pedestal 53, positioning of the bracket 50 and the pedestal 53 can be easily performed.

Other Embodiments

The present invention is not limited to the embodiments that have been described above with reference to the drawings, and embodiments such as those described below, for example, are also included in the technical scope of the present invention.

(1) In the foregoing embodiment, a configuration is adopted in which the pair of side walls 24 are formed on the bottom wall 23 of each bracket 15. However, a configuration may also be adopted in which only one side wall 24 is provided. Alternatively, a configuration may be adopted in which the side walls 24 are omitted. Moreover, although a configuration is adopted in which the pair of ribs 52 are formed in each bracket 50, the present invention is not limited to this, and the number of ribs 52 may be one or may be three or more.

(2) In the foregoing embodiment, a configuration is adopted in which the engagement portions 22 protruding downward are formed on each pedestal 20, and the engagement receiving portions 28A and 28B, which are in the form of through holes and into which the corresponding engagement portions 22 are inserted, are formed in each bracket 15. However, the present invention is not limited to this, and a configuration may also be adopted in which a protrusion (engagement receiving portion) is formed on each bracket 15, the protrusion protruding toward the corresponding pedestal 20, and a recess (engagement portion) into which the protrusion is inserted is formed in the pedestal 20. Alternatively, a configuration may be adopted in which the engagement portions 22 and the engagement receiving portions 28A and 28B are omitted.

(3) In the foregoing embodiment, a configuration is adopted in which the two brackets 15 are attached to the heat dissipation member 13. However, the present invention is not limited to this, and a configuration may be adopted in which one only bracket 15 is attached to the heat dissipation member 13, or a configuration may be adopted in which three or more brackets 15 are attached to the heat dissipation member 13.

(4) In the foregoing embodiment, a configuration is adopted in which the heat dissipation member 13 and each bracket 15 are fixed to each other by screwing the bolts 26 into the threaded holes 21A and 21B. However, the present invention is not limited to this, and the heat dissipation member 13 and the bracket 15 may be fixed to each other by welding, or may be fixed to each other by riveting, and any suitable method can be used as necessary.

(5) In the foregoing embodiment, a configuration is adopted in which each pedestal 20 has a rectangular prism shape. However, the present invention is not limited to this, and each pedestal 20 may have a cylindrical shape, an elliptic cylindrical shape, or an oblong cylindrical shape, or may have a polygonal prism shape such as a triangular prism shape or a pentagonal prism shape.

(6) In the foregoing embodiments, a configuration is adopted in which the electrical junction box 10 is disposed in an orientation in which the second surface 17 of the heat dissipation member 13 faces downward. However, the present invention is not limited to this, and the electrical junction box 10 can be installed in the vehicle 11 in any suitable orientation as necessary.

(7) In the foregoing embodiments, a configuration is adopted in which the heat dissipation member 13 is made of metal. However, the present invention is not limited to this, and, for example, any suitable material such as ceramic, a synthetic resin, or the like can be selected as necessary.

The invention claimed is:

1. An electrical junction box to be attached to a vehicle, the electrical junction box comprising:
   a heat dissipation member having a base plate portion that has a plate shape having a first surface and a second surface, a plurality of fins that protrude from the second surface, and a pedestal that is provided protruding from the second surface and that has a smaller protruding height from the second surface than the fins; and
   a bracket having a pedestal attachment portion that is attached to the pedestal and a vehicle body attachment portion that is continuous with the pedestal attachment portion, the vehicle body attachment portion extends in a direction away from the heat dissipation member, and wherein the vehicle body attachment portion is attachable to a vehicle body of the vehicle.

2. The electrical junction box according to claim 1, wherein the bracket has a bottom wall, and the bottom wall is provided with a reinforcement member protruding in a direction that intersects the bottom wall.

3. The electrical junction box according to claim 1, wherein the bracket has a bottom wall and a side wall extending upright from a side edge of the bottom wall, and
   the side wall is configured to come into contact with the pedestal from a direction that intersects a direction in which the pedestal protrudes from the second surface.

4. The electrical junction box according to claim 1, wherein the bracket has a bottom wall, the bottom wall having a rib that protrudes from the bottom wall and extends in the direction away from the heat dissipation member, and
   the rib is accommodated in an accommodating recess provided in the pedestal.

5. The electrical junction box according to claim 1, wherein one of the pedestal and the pedestal attachment portion has an engagement portion that is formed protruding toward the other of the pedestal and the pedestal attachment portion, and an engagement receiving portion engaging the engagement portion is formed in the other of the pedestal and the pedestal attachment portion.

6. The electrical junction box according to claim 1, further including a case, the case is attached to the first surface of the base plate portion.

7. The electrical junction box according to claim 2,
wherein the bracket has a bottom wall and a side wall extending upright from a side edge of the bottom wall, and
the side wall is configured to come into contact with the pedestal from a direction that intersects a direction in which the pedestal protrudes from the second surface.

8. The electrical junction box according to claim 2,
wherein the bracket has a bottom wall, the bottom wall having a rib that protrudes from the bottom wall and extends in the direction away from the heat dissipation member, and
the rib is accommodated in an accommodating recess provided in the pedestal.

9. The electrical junction box according to claim 3,
wherein the bracket has a bottom wall, the bottom wall having a rib that protrudes from the bottom wall and extends in the direction away from the heat dissipation member, and
the rib is accommodated in an accommodating recess provided in the pedestal.

10. The electrical junction box according to claim 2,
wherein one of the pedestal and the pedestal attachment portion has an engagement portion that is formed protruding toward the other of the pedestal and the pedestal attachment portion, and an engagement receiving portion engaging the engagement portion is formed in the other of the pedestal and the pedestal attachment portion.

11. The electrical junction box according to claim 3,
wherein one of the pedestal and the pedestal attachment portion has an engagement portion that is formed protruding toward the other of the pedestal and the pedestal attachment portion, and an engagement receiving portion engaging the engagement portion is formed in the other of the pedestal and the pedestal attachment portion.

12. The electrical junction box according to claim 4,
wherein one of the pedestal and the pedestal attachment portion has an engagement portion that is formed protruding toward the other of the pedestal and the pedestal attachment portion, and an engagement receiving portion engaging the engagement portion is formed in the other of the pedestal and the pedestal attachment portion.

13. The electrical junction box according to claim 2, further including a case, the case is attached to the first surface of the base plate portion.

14. The electrical junction box according to claim 3, further including a case, the case is attached to the first surface of the base plate portion.

15. The electrical junction box according to claim 4, further including a case, the case is attached to the first surface of the base plate portion.

16. The electrical junction box according to claim 5, further including a case, the case is attached to the first surface of the base plate portion.

\* \* \* \* \*